3,060,062
Patented Oct. 23, 1962

3,060,062

METHOD OF FORMING ELECTRICAL CONDUCTORS

George Katz, Philadelphia, Pa., and Otis D. Black, Haddon Heights, N.J., assignors to Radio Corporation of America, a corporation of Delaware No Drawing. Filed Mar. 2, 1960, Ser. No. 12,247
7 Claims. (Cl. 117—212)

The present invention relates generally to the art of forming patterns of electrical conductors on an insulating base. This art is sometimes referred to as that of making "printed circuits." More particularly, the invention relates to an improved method of forming electrical conductors in which powdered copper is used as the electrically conducting material.

Printed circuits are commonly made by an etching method utilizing a sheet of copper foil cemented to an insulating base such as laminated sheets of paper or cloth impregnated with a thermosetting adhesive which may be a phenol-formaldehyde resin. A pattern of a substance which is resistant to the etching solution to be used is applied to the foil in the configuration of the circuit desired. The portions of the copper foil not covered with the resist are etched away.

Some advantages of the above method are that it produces circuits having individual conductors of a high degree of uniformity and of good conductivity.

Some disadvantages are that it requires use of highly corrosive liquids which must be completely removed from the circuits to avoid future deterioration of equipment, that it is wasteful of copper, and that it is relatively time-consuming.

It has long been recognized that printed circuits could be made much more economically if the conductors could be formed by applying lines of a conductive substance directly on an insulating substrate without having to use resists and etching solutions. This has proved to be a difficult objective to achieve, however. There are not many substances which have sufficiently high conductivity in powdered form to be of possible use.

Most metals of good conductivity oxidize rather rapidly under ordinary atmospheric conditions and the oxidation is accentuated when the materials are in powdered form, due to the greatly increased surface area generated. Silver, for example, rapidly forms oxides and sulfides on its surfaces when exposed to air. However, in the case of silver, this is not a particular disadvantage since the oxides and sulfides are, themselves, good electrical conductors. It has therefore been found possible to make good conductive patterns of silver powder.

Silver, however, is undesirable in other respects as a material for manufacturing printed circuits. It is relatively expensive and therefore unsuited from a cost standpoint to be used in the manufacture of many types of equipment. It also has the undesirable property of growing needle-like projections, in the course of time, which eventually cause "shorts" between closely spaced conductors.

Copper, on the other hand, has the advantages of being relatively cheap and also relatively stable. But, it also forms surface oxides when exposed to air and these oxides are not good electrical conductors. Copper powder has therefore not proved suitable heretofore for printed circuit manufacture.

An object of the present invention is to provide an improved method of printed circuit manufacture utilizing powdered copper for forming the conductors.

Another object of the invention is to provide an improved method of forming electrical conductors out of powdered copper laid down on a substrate, in which the effect of surface oxidation of the metal particles is overcome.

These and other objects will be more apparent and the invention will be further explained in the description which follows.

Briefly, the invention is directed to an improved method of making printed circuits comprising mixing copper powder, the particles of which may contain on their surfaces up to about 1% by weight reductible contamination products such as copper oxides and sulfides, with a reducing or fluxing agent selected from the class consisting of polyhydric alcohols having more than three carbon atoms per molecule and acid and anhydride derivatives of these alcohols to form a paste; applying this paste to a heat-hardenable-adhesive surfaced insulating substrate to form conductors of desired shape; and heating to moderate temperature sufficient to drive off substantially all liquids from the paste while reducing the surface oxides and sulfides, etc. on the copper particles so that lines of relatively good electrical conductivity are formed. Better results are obtained if pressure is applied to the conductive pattern during the heating step.

A detailed example of carrying out the method of the present invention follows.

The insulating substrate, on which the conductive pattern is to be laid down, is first provided with a heat-hardenable adhesive surface. If the substrate is a laminated board impregnated with a thermosetting resin, for example, the board is coated with an adhesive such as an incompletely polymerized butyl phenolic thermosetting resin. However, the laminated board if impregnated with a phenol formaldehyde thermosetting resin, may be left such that the resin is in an incompletely polymerized state so that the surface is tacky.

A paste is prepared by mixing copper powder of commercial grade, having a purity of the order of 99%, and of about −200 mesh particle size with a liquid which includes a particular fluxing or reducing ingredient.

The liquid may comprise 50% by volume of a mixture of water and a non-crystallizing polyhydric alcohol capable of exerting a reducing action when heated. The polyhydric alcohol preferably consists of sorbitol to which anyhdrides and other polyhydric derivatives of sorbitol have been added to inhibit crystallization. A suitable polyhydric alcohol composition may be purchased commerically under the brand name "Arlex." The polyhydric alcohol and its derivatives may comprise about 83% by volume of this portion of the solution, water making up the remainder. The other 50% of the liquid may comprise 95% levulinic acid (the remaining 5% of this constituent being water). In this liquid, the fluxing portion is the sorbitol and its derivatives. But, since sorbitol is a humectant, that is, it absorbs water from the atmosphere, a drying ingredient, in this case levulinic acid, is included.

A paste is prepared by mixing the copper powder, referred to previously, with the liquid referred to immediately above, in the proportion of about 100 g. powder per 50 cc. liquid. Stirring the powder into the liquid provides a sufficiently good dispersion. In this proportion the composition has the proper viscosity for silk screening. If the composition is to be applied by some method other than silk screening, the proportions of copper powder and liquid will be different. If the composition is to be applied by spraying, for example, the relative amount of liquid should be higher.

When applied by silk screening, the composition is preferably applied to the adhesive-surfaced substrate previously referred to, in two separate coats. A first coat is applied and then dried under infra-red heat at about 100° C. for about 10–15 minutes. The second coat is then applied and the panel is then dried in an air-circulating oven for about one hour at 150° C. This treatment drives off substantially all liquids and produces copper conductors of relatively good conductivity. For lines ¼ inch wide and 3 inches long, resistances as low as 0.5 ohm have been obtained.

The copper pattern may be electroplated with additional thicknesses of metal to make it still more highly conductive. It is also readily solderable by dipping or other well known techniques.

The conductivity of the copper pattern may also be increased by applying heat and pressure. After the lines are laid down and dried, as described above, the panel may be placed between the platens of a press fitted with heating elements. First, the lines of copper are softened by applying low pressures at about 150° C. for 10–15 minutes. The pressure is then increased to about 2000 p.s.i. for about 20 minutes. The panel, while still under pressure, is then cooled to room temperature. In this way, lines ¼ inch wide and 3 inches long have had their resistances decreased to as low as 0.1 ohm. This is comparable to the resistivity of printed circuit copper conductors produced by etching techniques.

The improvement in conductivity that has been obtained with powdered copper, using the above described techniques, is due to the reduction of the oxides, sulfides and other similar reducible surface contaminants normally found on the surface of particles of copper powder, to metallic copper. The polyhydric alcohol is caused to act as a reducing agent by heating and reduces the less conductive copper compounds to the more conductive metallic copper. The reducing action appears to produce more intimate surface contact between the copper particles. The organic reaction products, water and other liquids present are presumably driven off by the continued heating.

If it were not for the presence of the levulinic acid in the composition, the drying of the printed conductors would be more difficult. Sorbitol and its anhydrides absorb water readily from the atmosphere. Levulinic acid inhibits this tendency.

During the heating operation, the adhesive on the insulating substrate is hardened by further polymerization.

The particle size of the copper which is used does not appear to be particularly critical. Satisfactory results have been obtained with particle size ranging from +100 mesh to −325 mesh with −200 mesh being preferred.

Fluxing or reducing agents other than sorbitol can be used in the method of the present invention. The agent used must however, be one capable of exerting a sufficient reducing action on copper compounds at the moderate temperatures permissable, that is, not much above 150° C. The reducing agent should also be one which is capable of having its oxidation products and anhydrides easily volatilized at this same temperature. Any hexahydric alcohol can be used, for example, any of the isomeric forms of sorbitol or mannitol, together with their common derivatives such as anhydrides, aldehydes and acids. Other polyhydric alcohols having more than three hydroxyl groups per molecule can also be used.

The proportion of polyhydric alcohol to copper powder can be varied considerably. The preferred amount is about 20% by weight alcohol with respect to metal but the alcohol can be present in an amount as low as 1% or as high as 50% of the copper. However, in amounts over about 20% of the copper, most of the alcohol is merely wasted.

Nearly all of the unused ingredients and reaction products of the fluxing composition are volatilized during the heating operation. The small amounts which may remain can be easily removed by rinsing with water. No corrosive products have been found even after storage of completed circuit boards for many months.

What is claimed is:

1. A method of forming an electrical conductor on an insulating base material comprising mixing copper powder containing reducible contamination products, with about 1% to 50% by weight, with respect to said copper, of a flux selected from the class consisting of polyhydric alcohols having more than three carbon atoms per molecule and acid and anhydride derivatives of said alcohols, applying the mixture to said base material which has been provided with a heat-hardenable adhesive surface in the tacky state, and heating the mixture and the base material to a temperature not higher than about 150° C. sufficient to reduce said reducible contamination products to metallic copper, to harden said adhesive surface, and to drive off substantially all easily volatilizable substances present.

2. A method according to claim 1 in which said flux is sorbitol.

3. A method according to claim 2 in which said mixture includes a volatilizable drying agent.

4. A method of forming a pattern of electrical conductors on an insulating base material comprising preparing a paste which includes copper powder containing reducible contamination products, sorbitol in an amount equal to about 1–20% by weight of said copper, and a volatilizable drying agent, providing said insulating base with a heat-hardenable adhesive surface, applying said paste to said adhesive surface in the form of said pattern, and heating to a moderate temperature sufficient to reduce said reducible contamination products and to drive off substantially all easily volatilizable substances present.

5. A method according to claim 4 in which said paste is applied in a plurality of separate coats, one coat being dried before the next coat is applied.

6. A method of forming an electrical conductor on an insulating base material comprising preparing a mixture including copper powder containing on its surfaces reducible contamination products, and about 1–50% by weight, with respect to said copper, of a flux selected from the class consisting of polyhydric alcohols having more than three carbon atoms per molecule and acid and anhydride derivative of said alcohols, providing on a surface of said base material a tacky, heat-hardenable adhesive coating, depositing said mixture on said coating, heating the assembly to a temperature not higher than about 150° C. sufficient to reduce said reducible contamination products, harden said adhesive and drive off substantially all easily volatilizable substances present, and then re-heating the conductor thus produced under pressure to increase the electrical conductivity thereof.

7. A method according to claim 6 in which said reheating is at a temperature of about 150° C. and the pressure applied for at least part of the cycle is of the order of 2000 p.s.i.

References Cited in the file of this patent

UNITED STATES PATENTS

| | | |
|---|---|---|
| 2,547,771 | Pessel | Apr. 3, 1951 |
| 2,721,152 | Hopf et al. | Oct. 18, 1955 |